United States Patent
Kang

(10) Patent No.: US 6,207,496 B1
(45) Date of Patent: Mar. 27, 2001

(54) METHOD OF FORMING CAPACITOR OF SEMICONDUCTOR DEVICE

(75) Inventor: Tae Woong Kang, Taejon-kwangyokshi (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/362,210

(22) Filed: Jul. 28, 1999

(30) Foreign Application Priority Data

Dec. 17, 1998 (KR) .................................................. 98/55605

(51) Int. Cl.[7] ...................... H01L 21/8242; H01L 21/336
(52) U.S. Cl. .......................... 438/253; 438/254; 438/256; 438/397
(58) Field of Search ..................................... 438/253, 254, 438/391, 397, 255, 256, 240

(56) References Cited

U.S. PATENT DOCUMENTS

| | | | |
|---|---|---|---|
| 5,518,948 | * 5/1996 | Walker | 437/60 |
| 5,753,547 | 5/1998 | Ying | 438/253 |
| 5,877,522 | * 3/1999 | Kasai | 257/306 |
| 5,952,687 | * 9/1999 | Kawakubo et al. | 257/296 |
| 6,008,084 | * 12/1999 | Sung | 438/241 |
| 6,008,085 | * 12/1999 | Sung et al. | 438/253 |
| 6,030,847 | * 2/2000 | Fazan et al. | 438/239 |
| 6,037,219 | * 3/2000 | Lin et al. | 438/255 |
| 6,046,083 | * 4/2000 | Lin et al. | 438/255 |
| 6,051,859 | * 4/2000 | Hosotani et al. | 257/306 |
| 6,090,655 | * 7/2000 | Zahurak et al. | 438/239 |
| 6,103,586 | * 8/2000 | Chetlur et al. | 438/396 |
| 6,131,019 | * 10/2000 | Lin | 438/253 |

* cited by examiner

Primary Examiner—Richard Elms
Assistant Examiner—Michael S. Lebentritt
(74) Attorney, Agent, or Firm—Morgan, Lewis & Bokius LLP

(57) ABSTRACT

Provided with a method of forming a capacitor of semiconductor devices including the steps of: forming a first insulating layer having a plurality of contact holes on a semiconductor substrate; forming a plug in each of the contact holes; sequentially forming a second insulating layer and a mask layer on the entire surface of the semiconductor substrate; selectively removing the mask layer to form a plurality of first mask patterns having a first line width between the plugs; selectively removing the first mask pattern to form second mask patterns having a second line width smaller than the first line width; removing the second insulating layer by using the second mask patterns as a mask so as to expose the plugs; sequentially forming a conductive layer and a third insulating layer on the entire surface of the semiconductor substrate for the sake of electrical connection to each plug; removing materials overlying the second insulating layer to expose the surface of the second insulating layer, and forming a lower electrode of capacitor composed of the conductive layer and each plug; and removing the third insulating layer and the second insulating layer to sequentially form a dielectric layer and an upper electrode of capacitor on the lower electrode of capacitor.

17 Claims, 9 Drawing Sheets

US 6,207,496 B1

METHOD OF FORMING CAPACITOR OF SEMICONDUCTOR DEVICE

BACKGROUND OF THE INVENTION

1. Field of the Invention

The present invention relates to a process for fabricating a semiconductor device and, more particularly, to a method of forming a capacitor of semiconductor devices which is designed to increase the capacitor capacity by maximizing the area of the lower electrode of the capacitor.

2. Discussion of Related Art

With a development of semiconductor devices, many studies have been made to integrate more devices on a single semiconductor chip.

Especially, a variety of cell structures have been suggested in order to minimize the size of device in the dynamic random access memory (DRAM) cell.

It is desirable to construct the memory cell with one transistor and one capacitor in an aspect that the area of the device on a chip should be minimized for the sake of a very large integration.

In such a memory cell having one capacitor, signal charges are stored in the lower electrode (storage node) of a capacitor connected to the transistor (switching transistor).

With a decrease in the size of the memory cell owing to large integration of the semiconductor memory device, the capacitor becomes smaller and accordingly the number of the signal charges storable in the lower electrode decreases.

It is thus necessary that the lower electrode of the capacitor of the memory cell should be greater than a predetermined value in order to secure a capacitor capacity required to transfer desired signals without a malfunction.

To minimize the size of the memory cell, the lower electrode of capacitor must be large in area relatively within a limited region on a semiconductor substrate.

Various methods have been proposed as to enhance the surface area of the lower electrode of the capacitor.

Hereinafter, a method of forming a capacitor of semiconductor devices according to prior art will be described with reference to the accompanying drawings.

FIGS. 1a–1h are cross-sectional views for illustrating the method of forming a capacitor of semiconductor devices according to the prior art.

Figure 1A:
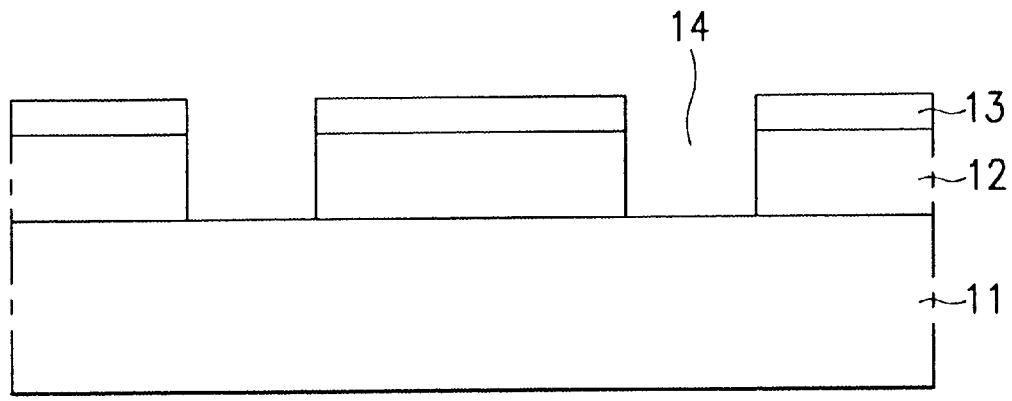

As shown in FIG. 1a, a first oxide layer 12 is formed on a semiconductor substrate 11 and a nitride layer 13 being formed on the first oxide layer 12.

A photoresist (not shown) is then deposited on the nitride layer 13. A photo-etching process is performed to selectively remove the nitride layer 13 and the first oxide layer 12 so as to expose a defined portion of the surface of the semiconductor substrate 11, forming a plurality of contact holes 14.

Figure 1B:
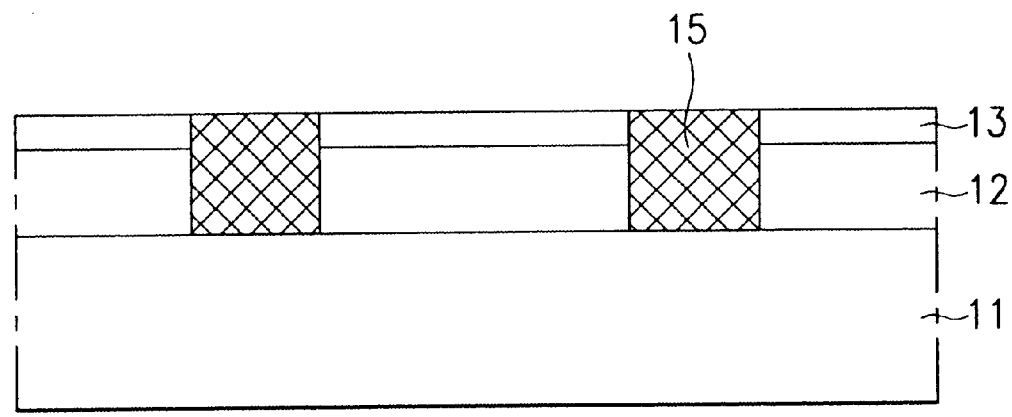

As shown in FIG. 1b, polysilicon is deposited on the entire surface of the semiconductor substrate 11 including the contact holes 14. The entire surface of the resulting material is subjected to etch back process or chemical mechanical polishing (CMP) process, forming a plug 15 inside each of the contact hole 14.

Figure 1C:
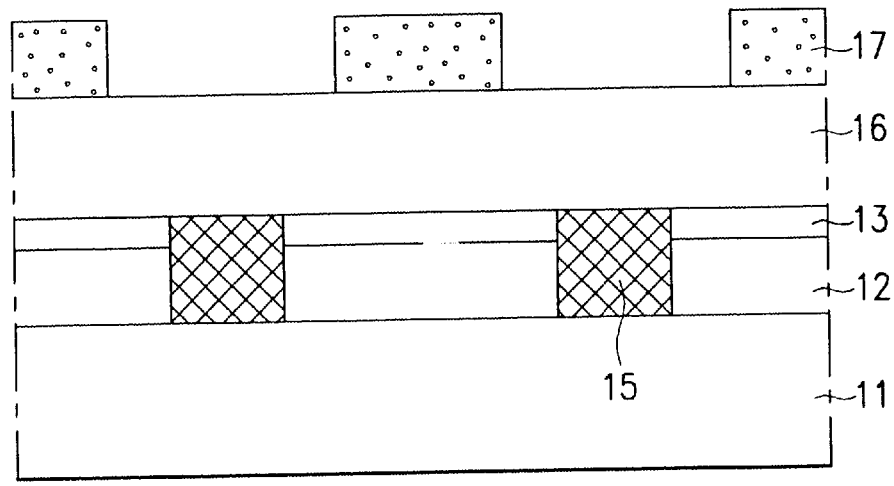

As shown in FIG. 1c, a second oxide layer 16 is formed on the entire surface of the semiconductor substrate 11 including the plugs 15.

After the subsequent deposition of photoresist 17 on the second oxide layer 16, the photoresist 17 is patterned by exposure and development.

Figure 1D:
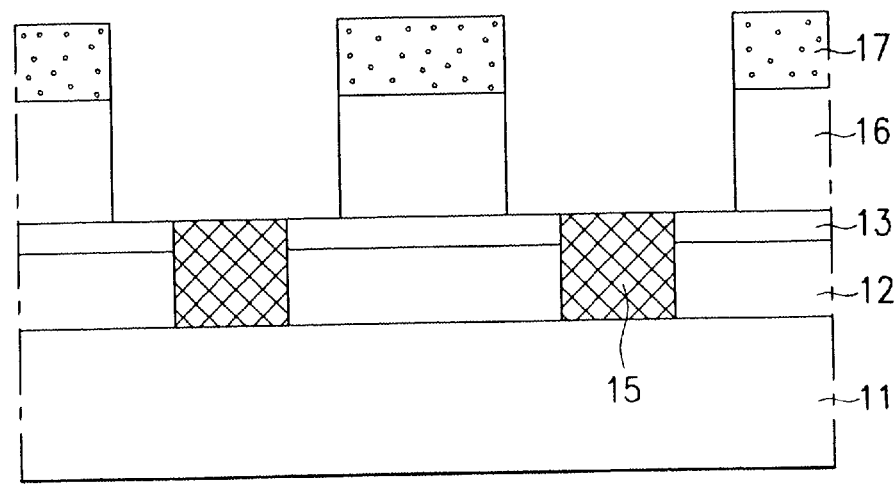

As shown in FIG. 1d, the patterned photoresist 17 is used as a mask in selectively removing the second oxide layer 16 to expose the surface of the nitride layer 13 adjacent to the plugs 15.

The nitride layer 13 is used as an etching stopper layer in selectively removing the second oxide layer 16.

Figure 1E:
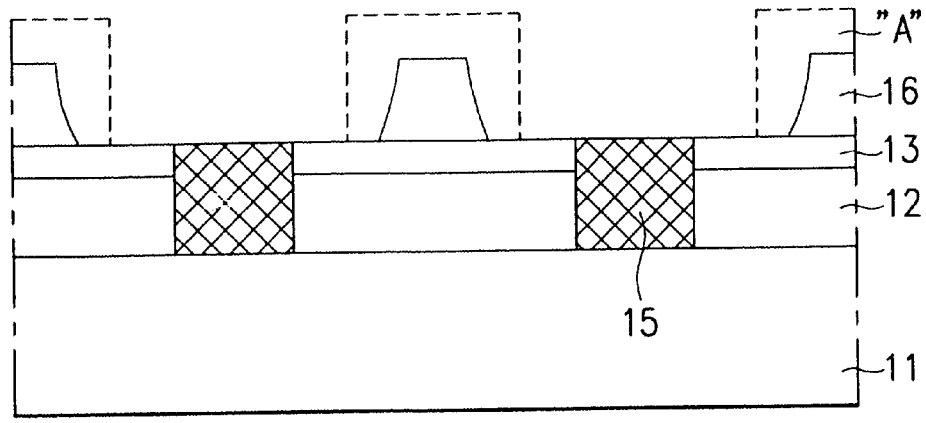

As shown in FIG. 1e, the photoresist 17 is removed and the second oxide layer 16 selectively removed is wet-etched to broaden a region in which the lower electrode of capacitor will be formed.

That means, the capacitor capacity of the lower electrode that will be formed later is enhanced because the distance between the lower electrodes of the capacitor decreases by selectively removing the second oxide layer 16 by the wet etching process.

In performing the wet etching, the second oxide layer 16 is etched further in the upper part than the lower part because of the loading effect.

Unexplained part "A" is a portion of the second oxide layer 16 removed by the wet etching.

Figure 1F:
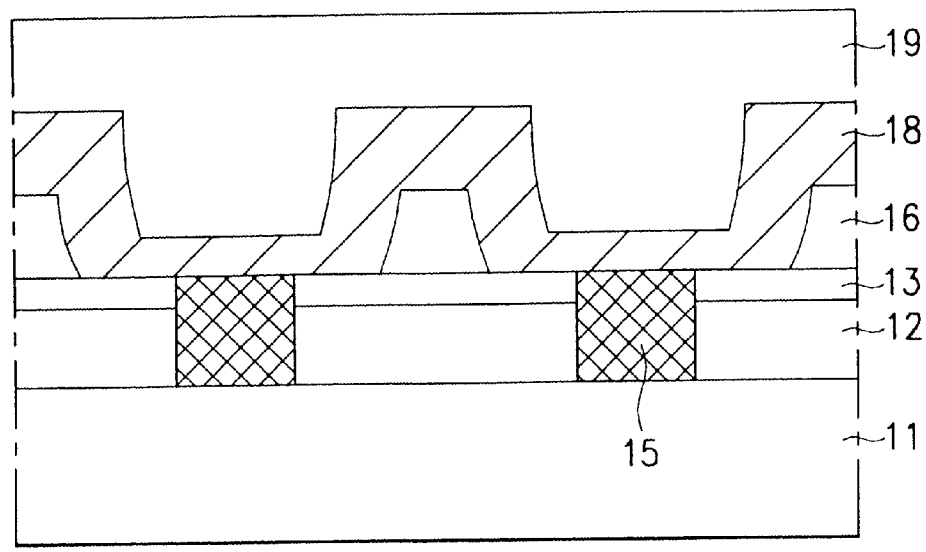

As shown in FIG. 1f, a conductive layer 18 for the lower electrode of the capacitor electrically connected to each of the plug 15 is formed on the entire surface of the semiconductor substrate 11 including the remaining second oxide layer 16. A third oxide layer 19 is then formed on the conductive layer 18.

Figure 1G:
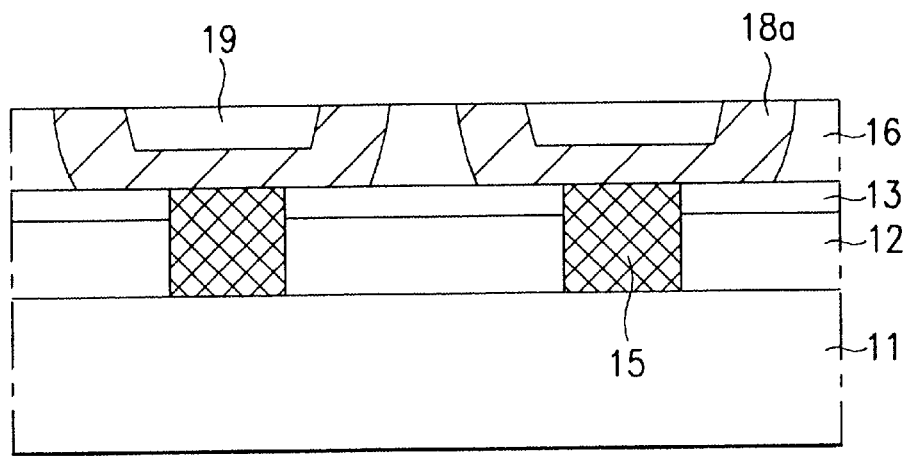

As shown in FIG. 1g, an etch back process or CMP process is performed on the entire surface of the second oxide layer 19 and the conductive layer 18 so as to expose the surface of the second oxide layer 16, selectively removing the third oxide layer 19 and the conductive layer 19 and forming a lower electrode 18a of capacitor having an inner-type crown structure.

Figure 1H:
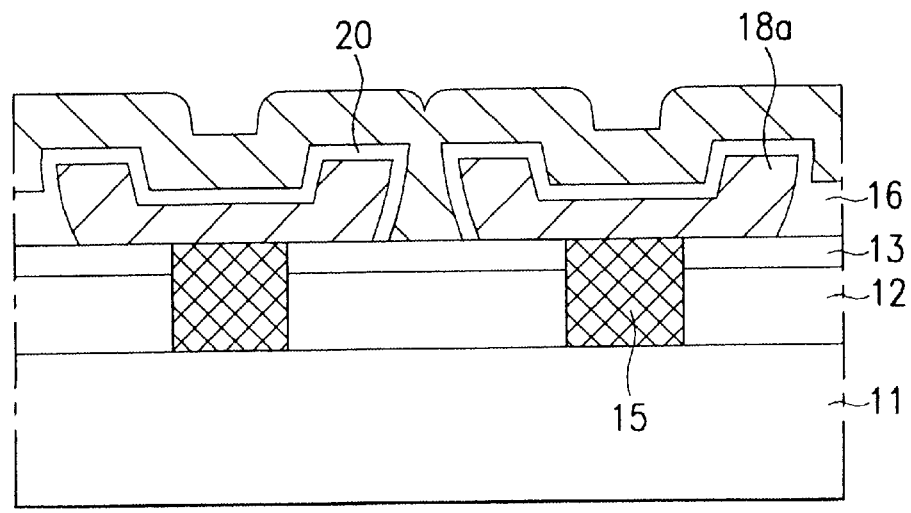

As shown in FIG. 1h, a wet etching is performed to remove the third oxide layer 19 and the second oxide layer 16. On the lower electrode 18a of capacitor are sequentially formed dielectric layer 20 and upper electrode 21 of capacitor, finally completing the related art process for forming a capacitor.

In the related art method of forming a capacitor of semiconductor devices, however, there are several problems as folLows.

First, an additional wet etching process is required in reducing the distance between the lower electrodes in the photo-etching process when fabricating an inner-type capacitor. Thus the process becomes complicated.

That means, it is necessary to carry out another wet etching process because the minimum distance between the lower electrodes in the 256M DRAM is less than 0.1 μm and thus defining a desired distance between the lower electrodes in the photo-etching process is difficult to realize.

Second, uniform wet etching of the entire cells is not easy to realize because the area to be wet-etched is increased with an inclination that the capacitor increases in height, and the aspect ratio becomes larger.

Third, the upper part of the lateral sides of each cell is further wet-etched due to the loading effect in such a manner that it is impossible to reduce the distance between the lower electrodes sufficiently.

SUMMARY OF THE INVENTION

Accordingly, an object of the present invention is to provide a method of forming a capacitor of semiconductor devices which is to enhance the capacitor capacity by minimizing the distance between the lower electrodes and maximizing the area of the lower electrode in the process of fabricating a capacitor having an inner-type crown structure.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of forming a capacitor of semiconductor devices includes the steps of: forming a first insulating layer having a plurality of contact holes on a semiconductor substrate; forming a plug in each of the contact holes; sequentially forming a second insulating layer and a mask layer on the entire surface of the semiconductor substrate; selectively removing the mask layer to form a plurality of first mask patterns having a first line width between the plugs; selectively removing the first mask pattern to form second mask patterns having a second line width smaller than the first line width; removing the second insulating layer by using the second mask patterns as a mask so as to expose the plugs; sequentially forming a conductive layer and a third insulating;layer on the entire surface of the semiconductor substrate for the sake of electrical connection to each plug; removing materials overlying the second insulating layer to expose the surface of the second insulating layer, and forming a lower electrode of capacitor composed of the conductive layer and each plug; and removing the third insulating layer and the second insulating layer to sequentially form a dielectric layer and an upper electrode of capacitor on the lower electrode of capacitor.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIGS. 1a–1h are cross-sectional views for illustrating a method of forming a capacitor of semiconductor devices according to prior art; and FIGS. 2a–2j are cross-sectional views for illustrating a method of forming a capacitor of semiconductor devices according to the present invention.

DETAILED DESCRIPTION OF PREFERRED EMBODIMENT

Hereinafter, a method of forming a capacitor of semiconductor devices according to the present invention will be described in detail with reference to the accompanying drawings.

FIGS. 2a–2j are cross-sectional views for illustrating the method of forming a capacitor of semiconductor devices according to the present invention.

Figure 2A:
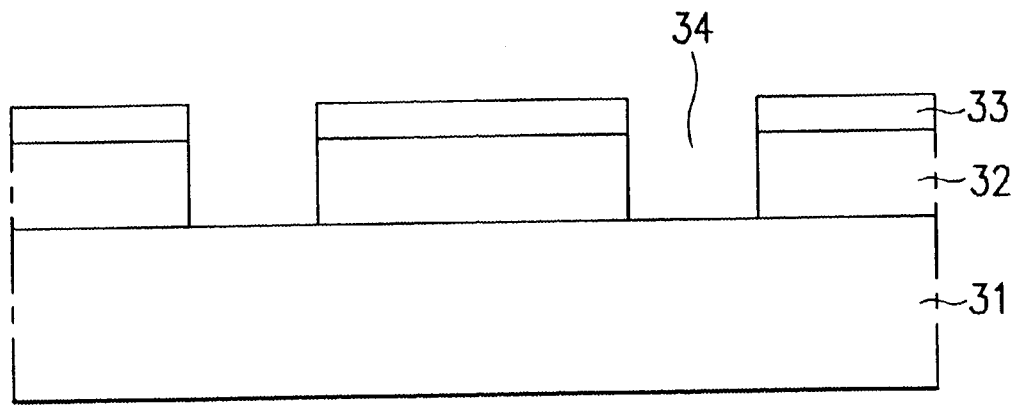

As shown in FIG. 2a, a first oxide layer 32 is formed on a semiconductor substrate 31 and a nitride layer 33 being formed on the first oxide layer 32.

A photoresist (not shown) is subsequently deposited on the nitride layer 33. A photo process is performed to selectively remove the nitride layer 33 and the first oxide layer 32 so as to expose a defined portion of the surface of the semiconductor substrate 31, forming a plurality of contact holes 34.

Figure 2B:
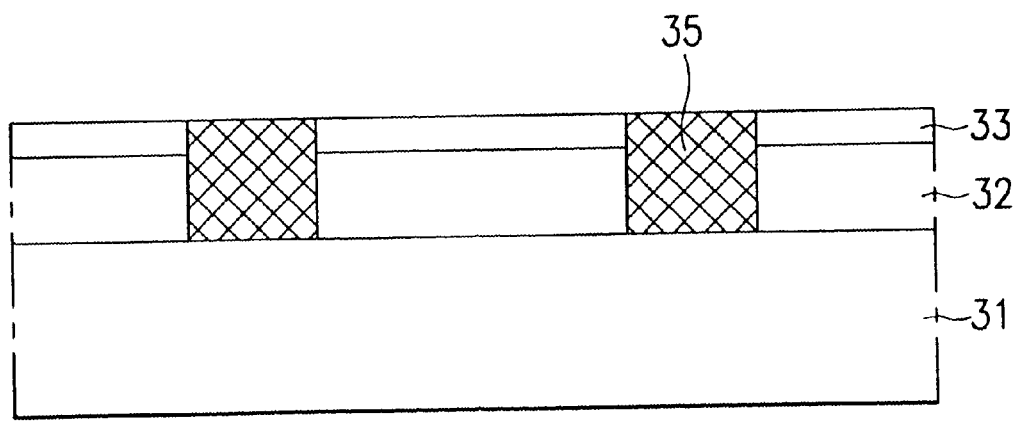

As shown in FIG. 2b, polysilicon is deposited on the entire surface of the semiconductor substrate 31 including the contact holes 34. The entire surface of the resulting material is subjected to etch back process or chemical mechanical polishing (CMP) process, forming a plug 35 inside each of the contact hole 34.

The plug 35 is to connect the lower electrode of a capacitor that will be formed later to the active region (source or drain region of transistor).

Figure 2C:
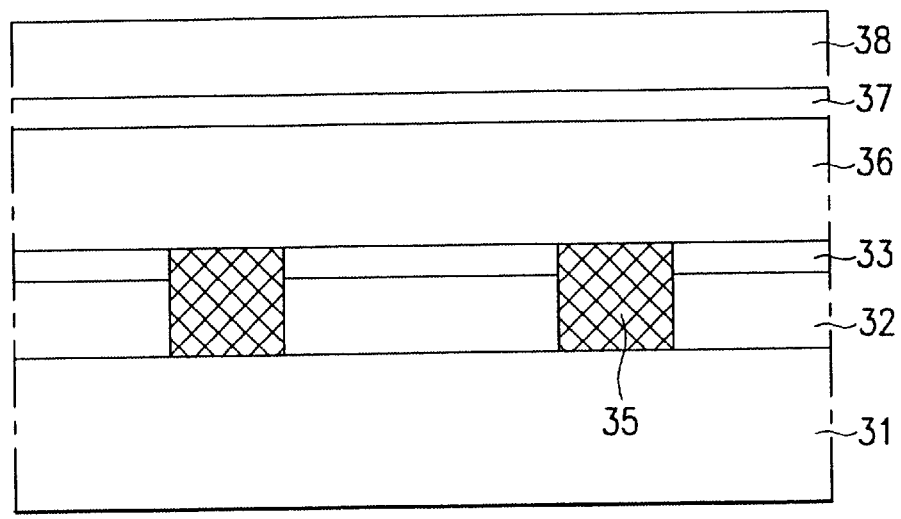

As shown in FIG. 2c, a second oxide layer 36 is formed on the entire surface of the semiconductor substrate 31 including the plugs 35.

The height of the capacitor that will be formed later is determined by the thickness of the second oxide layer 36.

A first hard mask layer 37 is formed on the second oxide layer 36. On the first hard mask layer 37 is formed a second hard mask layer 38 having the etching selectivity ratio different from that of the first hard mask layer 37.

The first hard mask layer 37 is made from a nitride layer or polysilicon having the etching selectivity ratio different from that of the second oxide layer 36. The second hard mask layer 38 is formed from an oxide layer or a thin film controllable in thickness through a wet etching.

Alternatively another single hard mask layer having the etching selectivity ratio different from that of the second oxide layer 36 may be formed without using a double hard mask layer, that is, first and second hard mask layers 37 and 38.

Figure 2D:
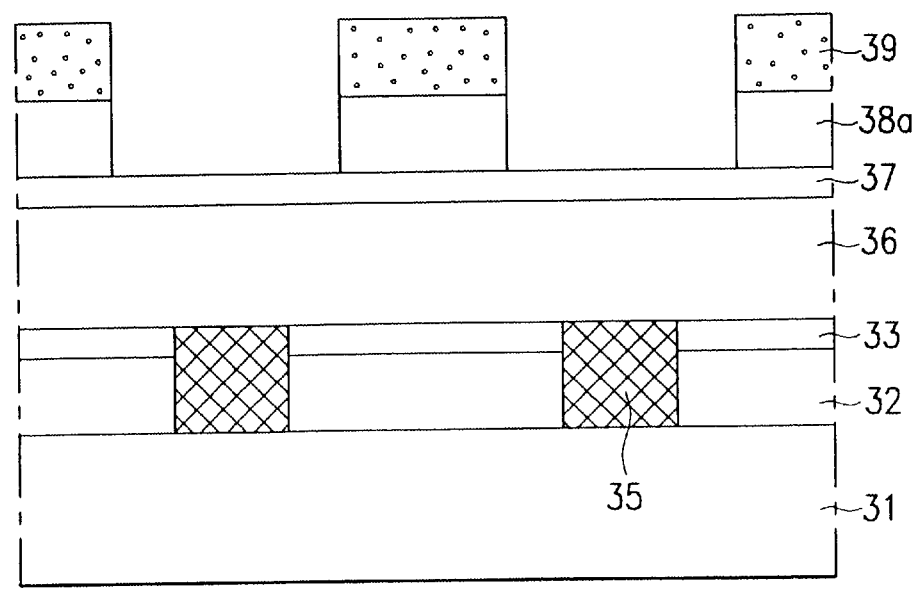

As shown in FIG. 2d, after deposition of photoresist 39 on the second hard mask layer 38, the photoresist 39 is patterned by exposure and development.

The patterned photoresist 39 is used as a mask in selectively removing the second oxide layer 16 to form a second hard mask pattern 38a.

Figure 2E:
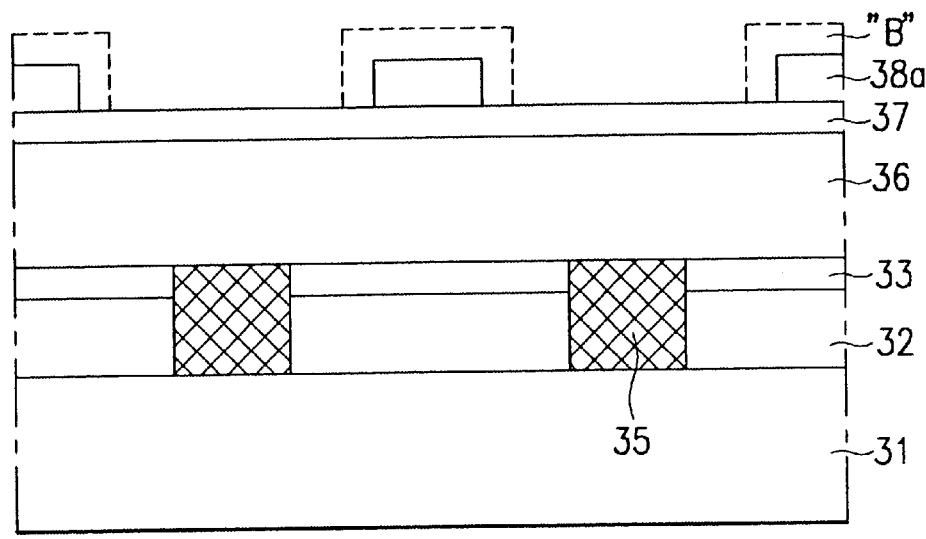

As shown in FIG. 2e, the photoresist 39 is removed and a wet etching is performed on the second hard mask pattern 38a to decrease the line width of the second hard mask pattern 38.

The wet etching uses a solution of phosphoric acid in reducing the line width of the second hard mask pattern 38a.

Unexplained part "B" is a portion of the second hard mask pattern 38a selectively etched with a phosphoric acid solution.

Figure 2F:
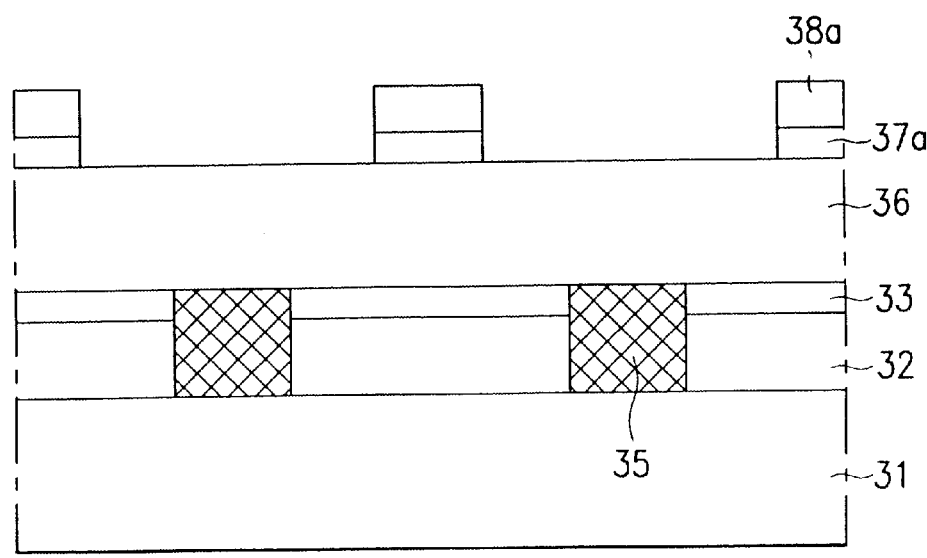

As shown in FIG. 2f, the wet-etched second hard mask pattern 38a is used as a mask in selectively removing the first hard mask layer 37 to form a first hard mask pattern 37a.

Figure 2G:
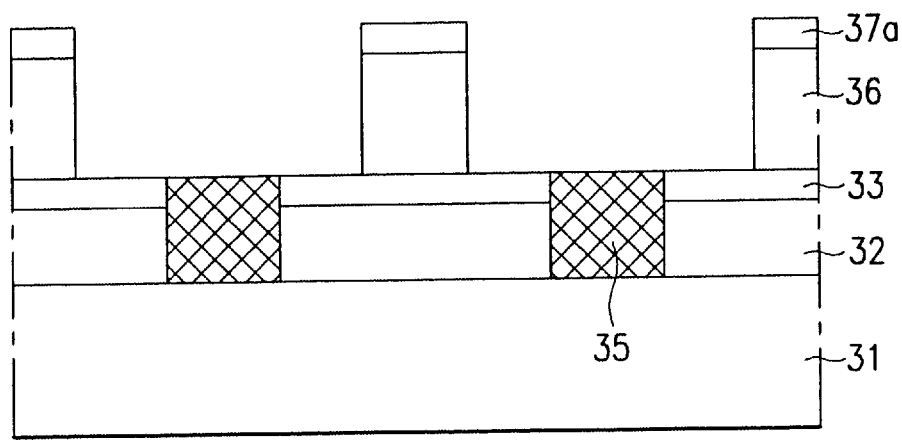

As shown in FIG. 2g, the first hard mask pattern 37a is used as a mask in selectively etching the second oxide layer 36 so as to expose the surface of the plug 35 and the neighboring second nitride layer 33.

The second oxide layer 36 is removed by a dry etching using the first hard mask pattern 37a as a mask, and the second hard mask pattern 38a is removed as well as the second oxide layer 36 during removal of the second oxide layer 36.

Figure 2H:
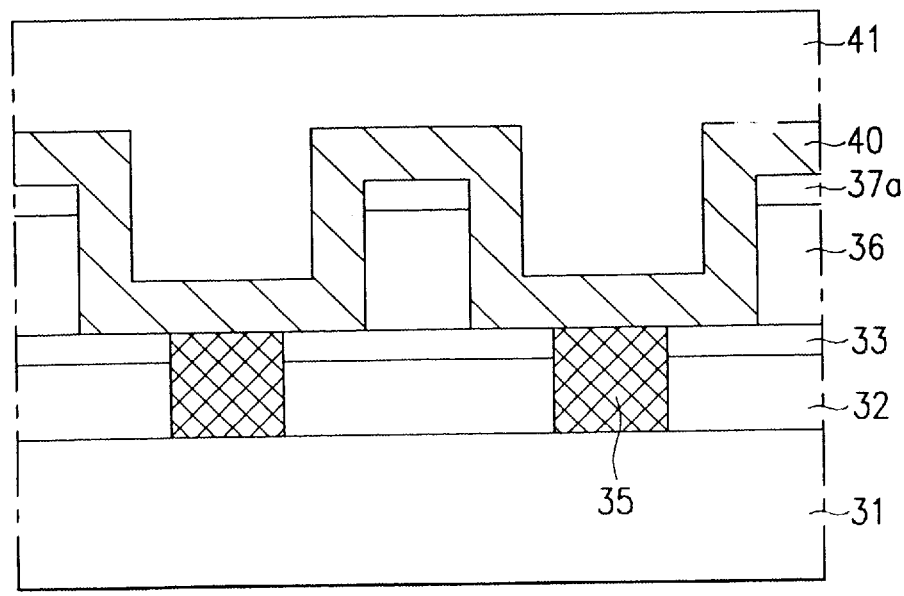

As shown in FIG. 2h, a conductive layer 40 for the lower electrode of capacitor electrically connected to each of the plug 35 is formed on the entire surface of the semiconductor substrate 31 including the first hard mask pattern 37a. A third oxide layer 41 is then formed on the conductive layer 40.

Figure 2I:
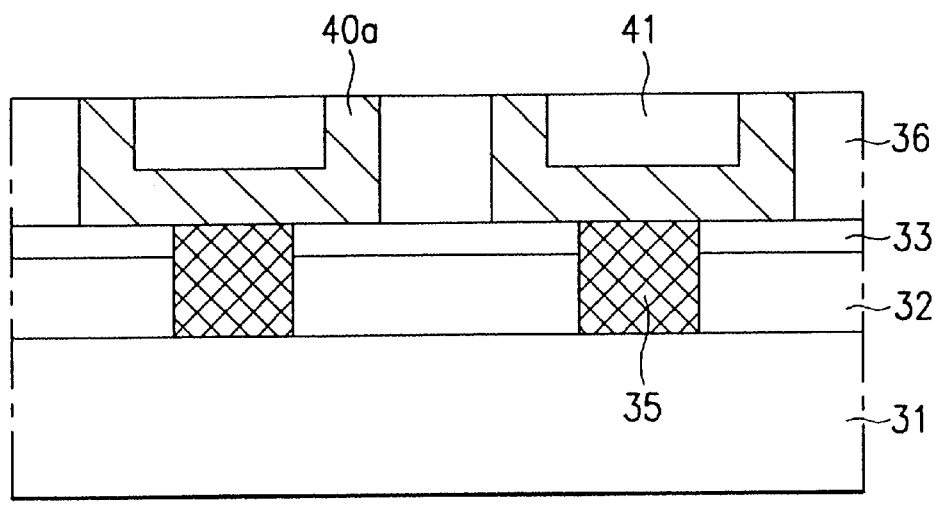

As shown in FIG. 2i, an etch back process or CMP process is performed on the entire surface of the third oxide layer 41 and the conductive layer 40 so as to expose the surface of the second oxide layer 36, selectively removing the third oxide layer 41 and the conductive layer 40 and forming a lower electrode 40a of capacitor having an inner-type crown structure.

The first hard mask pattern 37a is removed when forming the lower electrode 40a of capacitor by selectively removing the conductive layer 40 by the CMP process.

Figure 2J:
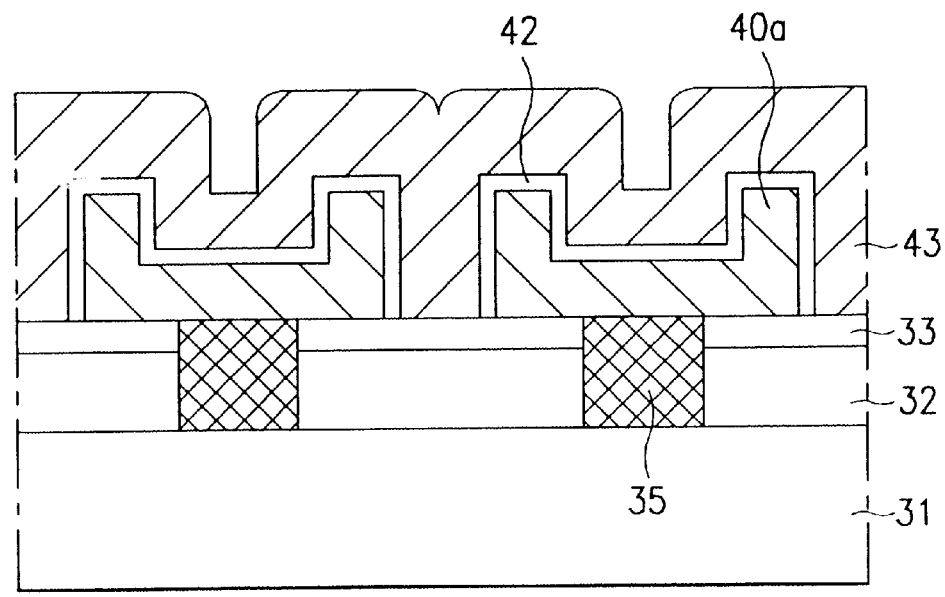

As shown in FIG. 2j, a wet etching is performed to remove the second oxide layer 36 and the third oxide layer 41. On the lower electrode 40a of capacitor are sequentially formed dielectric layer 42 and upper electrode 43 of capacitor, finally completing the present invention process for forming a capacitor.

The method of forming a capacitor of semiconductor devices in the present invention as described above has the following problems.

First, it is profitable to the subsequent photo process because planarization is well realized with the capacitor having an inner-type crown structure.

Second, the distance between the lower electrodes of capacitor can be reduced to an optimum value (below 0.2 $\mu$m) in the capacitor having an inner-type crown structure, as a result of which the area of the lower electrode of capacitor is maximized to enhance the capacitor capacity.

It will be apparent to those skilled in the art that various modifications and variations can be made in the method of forming a capacitor of semiconductor devices according to the present invention without departing from the spirit or scope of the invention. Thus, it is intended that the present invention cover the modifications and variations of this invention provided they come within the scope of the appended claims and their equivalents.

What is claimed is:

1. A method of forming a capacitor of semiconductor devices comprising the steps of:
    forming a first insulating layer having a plurality of contact holes on a semiconductor substrate;
    forming a plug in each of the contact holes;
    sequentially forming a second insulating layer and a mask layer on the entire surface of the semiconductor substrate;
    selectively removing the mask layer to form a plurality of first mask patterns having a first line width between the plugs;
    selectively removing the first mask patterns to form second mask patterns having a second line width smaller than the first line width;
    removing the second insulating layer by using the second mask patterns as a mask so as to expose the plugs;
    sequentially forming a conductive layer and a third insulating layer on the entire surface of the semiconductor substrate for electrical connection to each plug; selectively removing the third insulating layer and the conductive layer overlying the second insulating layer to expose the surface of the second insulating layer, and forming a lower electrode of capacitor composed of the conductive layer and each plug; and
    removing the third insulating layer and the second insulating layer to sequentially form a dielectric layer and an upper electrode of capacitor on the lower electrode of capacitor.

2. The method as claimed in claim 1, wherein the first insulating layer is formed from oxide layer and nitride layer laminated sequentially.

3. The method as claimed in claim 1, wherein the mask layer is formed from a material having the etching selectivity ratio different from that of the second insulating layer.

4. A method of forming a capacitor of semiconductor devices comprising the steps of:
    forming a first insulating layer having a plurality of contact holes on a semiconductor substrate;
    forming a plug in each of the contact holes;
    forming a second insulating layer on the entire surface of the semiconductor substrate;
    sequentially forming first and second mask layers on the second insulating layer;
    selectively removing the second mask layer to form a plurality of first mask patterns having a first line width between the plugs;
    selectively removing each of the first mask patterns to form a second mask patterns having a second line width smaller than the first line width;
    patterning the first mask layer by using the second mask patterns as a mask;
    removing the second insulating layer by using the first mask layer patterned so as to expose each of the plugs;
    sequentially forming a conductive layer and a third insulating layer on the entire surface of the semiconductor substrate for electrical connection to each plug;
    selectively removing the third insulating layer and the conductive layer overlying the second insulating layer so as to expose the surface of the second insulating layer and forming a lower electrode of capacitor composed of the conductive layer and each plug; and
    removing the third insulating layer and the second insulating layer, and forming a dielectric layer and an upper electrode of capacitor on the lower electrode of capacitor.

5. The method as claimed in claim 4, wherein the first insulating layer is formed from oxide layer and nitride layer laminated sequentially.

6. The method as claimed in claim 4, wherein the second mask layer is formed from an oxide layer.

7. The method as claimed in claim 4, wherein the first mask layer is formed from a nitride layer or polysilicon.

8. The method as claimed in claim 4, wherein the second mask pattern having the second line width is formed by selectively removing the first mask pattern by a wet etching.

9. The method as claimed in claim 8, wherein the wet etching uses a solution of fluoric acid.

10. The method as claimed in claim 4, wherein the lower electrode of capacitor is formed by using the surface of the second insulating layer as an etching stopper layer in an etch back process or chemical mechanical polishing (CMP) process.

11. The method as claimed in claim 4, wherein the height of the capacitor is determined by the thickness of the second insulating layer.

12. The method as claimed in claim 4, wherein the third insulating layer is formed from an oxide layer.

13. The method as claimed in claim 4, wherein the plugs are formed from polysilicon.

14. The method as claimed in claim 4, wherein the first and second mask layers are formed from materials different in etching selectivity ratio from each other.

15. The method as claimed in claim 4, wherein the first mask layer is formed from a material having the etching selectivity ratio different from that of the second insulating layer.

16. The method as claimed in claim 4, wherein the second mask patterns are removed simultaneously when selectively removing the second insulating layer.

17. The method as claimed in claim 4, wherein the second insulating layer and the second mask layer are formed from materials having the same etching selectivity ratio.

* * * * *